(12) United States Patent
Garcia

(10) Patent No.: US 8,414,734 B2
(45) Date of Patent: Apr. 9, 2013

(54) VERSATILE SYSTEM FOR SELF-ALIGNING DEPOSITION EQUIPMENT

(75) Inventor: Martin B. Garcia, Princeton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 762 days.

(21) Appl. No.: 11/756,361

(22) Filed: May 31, 2007

(65) Prior Publication Data
US 2007/0221124 A1    Sep. 27, 2007

Related U.S. Application Data

(62) Division of application No. 10/959,269, filed on Oct. 6, 2004, now Pat. No. 7,238,623.

(51) Int. Cl.
*H01L 21/36* (2006.01)
*C23C 16/52* (2006.01)
*C23C 16/54* (2006.01)

(52) U.S. Cl. .......... 156/345.34; 118/715; 118/300; 118/506; 156/345.33

(58) Field of Classification Search .......... 118/715, 118/300, 506; 156/345.33, 345.34
See application file for complete search history.

(56) References Cited

U.S. PATENT DOCUMENTS

| | | | |
|---|---|---|---|
| 4,870,923 A | | 10/1989 | Sugimoto |
| 4,987,856 A | * | 1/1991 | Hey et al. ............... 118/723 E |
| 5,232,508 A | * | 8/1993 | Arena et al. ............... 118/719 |
| 5,304,248 A | | 4/1994 | Cheng et al. |
| 5,356,515 A | * | 10/1994 | Tahara et al. .............. 438/715 |
| 5,698,070 A | * | 12/1997 | Hirano et al. .............. 438/729 |
| 5,935,395 A | * | 8/1999 | Ouellet et al. .......... 204/298.07 |
| 6,210,754 B1 | * | 4/2001 | Lu et al. .................. 427/248.1 |
| 6,239,043 B1 | * | 5/2001 | Lai ........................... 438/782 |
| 6,868,888 B2 | * | 3/2005 | Adachi ...................... 156/540 |
| 2002/0020954 A1 | * | 2/2002 | Cannon et al. .............. 269/239 |
| 2007/0221124 A1 | * | 9/2007 | Garcia ....................... 118/300 |

FOREIGN PATENT DOCUMENTS

JP    07-245292    *    9/1995

OTHER PUBLICATIONS

Webster's New College Dictionary, Copyright 2005 by Wiley Publishing, Inc., Cleaveland, Ohio, pp. 1-3.

* cited by examiner

*Primary Examiner* — Jeffrie R Lund
*Assistant Examiner* — Satish Chandra
(74) *Attorney, Agent, or Firm* — Alan A. R. Cooper; Wade J. Brady, III; Frederick J. Telecky, Jr.

(57) ABSTRACT

The present invention provides a system (100) for aligning a dispensing apparatus (110) utilized within a semiconductor deposition chamber (102). A stationary reference apparatus (106) is disposed along the bottom of the deposition chamber. A self-alignment support system (122), comprising one or more support components (124), is intercoupled between the dispensing apparatus and a deposition system exterior component (112). The self-alignment support system is adapted to facilitate and secure repositioning of the dispensing apparatus responsive to pressure applied to the dispensing surface (114) thereof. A non-yielding offset component (126) is placed upon a first surface (108) of the stationary reference apparatus. The dispensing surface of the dispensing apparatus is engaged with the offset component, and pressure is applied to the dispensing apparatus via the offset component until a desired alignment is achieved.

21 Claims, 2 Drawing Sheets

VERSATILE SYSTEM FOR SELF-ALIGNING DEPOSITION EQUIPMENT

This application is a divisional of application Ser. No. 10/959,269, filed Oct. 6, 2004.

TECHNICAL FIELD OF THE INVENTION

The present invention relates generally to the field of manufacturing semiconductor devices and, more particularly, to apparatus and methods for providing self-aligning deposition equipment.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size.

As device geometries and features continually decrease in size, and as new materials are introduced into semiconductor fabrication processes, many traditional semiconductor fabrication techniques and processes are rendered impractical or unusable. In order to adapt to the unique demands of new technologies (e.g., deep sub-micron), existing fabrication processes must renovated, or abandoned in favor of new fabrication processes. Consider, for example, conventional semiconductor deposition processes. Some conventional deposition techniques are simply not capable of depositing semiconductor material at sub-micron levels or tolerances. Alternative deposition processes—such as thin-film deposition—have been developed in response, to more adequately accommodate the demands of fabricating sub-micron device structures.

Thin-film deposition techniques, and other similar processes, often rely on relatively large, flat dispensing apparatus—commonly referred to as "showerheads"—to deposit a very fine layer of a semiconductor material across a significant portion of a semiconductor wafer surface. Ideally, if the showerheads are properly aligned, the semiconductor material is deposited in a uniform manner across the surface. This is important because non-uniformities in thin-film materials can cause a number of variances in device performance or reliability, degrading process yields. In many cases, however, showerheads frequently fall out of alignment during processing. Deposition on semiconductor wafers must therefore routinely be halted, while adjustments are made to properly align the showerheads.

This routine process interruption introduces a significant degree of delay and inefficiency into fabrication processes utilizing such apparatus. Such inefficiencies and delays are further compounded and increased by a number of impediments inherent in conventional showerhead alignment methodologies. Most such systems require numerous iterations (e.g. 6, 8, 12) of laborious and tedious manual measurements and calibrations—each of which may take several hours, individually.

These manual adjustment procedures thus frequently take many (e.g., ~12 or more) hours and, in some cases, days to complete—as the deposition system is repetitively operated, measured and adjusted until proper alignment is achieved. This causes a number of bottlenecks in the fabrication process, and places an inordinate drain on other process resources. Furthermore, conventional alignment methodologies commonly rely, in large part, on the subjective measurements and adjustments of operators performing the alignment procedures. This introduces, to at least a minimal extent, some degree of human error and unavoidable incongruity to the thin film deposition process. Non-uniformities that result over time can have further detrimental impacts on process yields and stability.

As a result, there is a need for a system for aligning deposition equipment and apparatus, such as thin-film deposition showerheads, that provides accurate and consistent equipment alignment while reducing or eliminating the need for iterative alignment processes, improving process efficiency, yield and reliability in an easy, efficient and cost-effective manner.

SUMMARY OF THE INVENTION

The present invention provides a versatile system, comprising a number of apparatus and methods, for providing self-aligning deposition equipment and apparatus—such as thin-film deposition showerheads. The system of the present invention provides accurate and consistent equipment alignment, while obviating the need for iterative alignment processes. Subjective inconsistencies and errors inherent in conventional methodologies are removed by the present invention—replaced by standardized system, apparatus and procedures. By the present invention, the process of aligning deposition equipment is optimized for efficiency and accuracy, improving process efficiency, yield and reliability in an easy and cost-effective manner.

The system of the present invention accurately and reproducibly aligns or levels a first, adjustable apparatus with respect to a second, stationary apparatus. A standardized spacing or offset component is placed or secured along an operational surface of the stationary apparatus during alignment procedures. The spacing component is formed or assembled of a dimension or configuration corresponding to the desired or required operational offset between the adjustable apparatus and the stationary apparatus—thereby defining a proper alignment position for the adjustable apparatus.

The adjustable apparatus is brought into proximity with stationary apparatus. A self-alignment support system supports the adjustable apparatus. This self-alignment support system comprises a number of securely repositionable support components, which shift or otherwise yield responsive to pressure exerted against an operational surface of the adjustable apparatus. As the adjustable apparatus is moved toward its operational position vis-à-vis the stationary component, the operational surface of the adjustable apparatus contacts or otherwise engages the offset component. Pressure exerted against the operational surface, as the adjustable apparatus is moved into its desired or required operational position against the offset component, forces one or more of the support components within the self-alignment support system to slide, move or otherwise shift to accommodate the forced repositioning of the adjustable apparatus by the offset component. Once aligned, the offset component may be removed from the stationary apparatus, as normal operation is resumed.

More specifically, embodiments of the present invention provide various apparatus and methods for aligning a dispensing apparatus utilized within a semiconductor deposition chamber. A stationary reference apparatus is disposed along the bottom of the deposition chamber. A self-alignment support system, comprising one or more support components, is intercoupled between the dispensing apparatus and a deposition system exterior component. The self-alignment support system is adapted to facilitate and secure repositioning of the dispensing apparatus responsive to pressure applied to the dispensing surface thereof. A non-yielding offset component is placed upon a first surface of the stationary reference apparatus. The dispensing surface of the dispensing apparatus is engaged with the offset component, and pressure is applied to the dispensing apparatus via the offset component until a desired alignment is achieved.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. Certain aspects of the present invention, for example, are hereafter illustratively described in specific conjunction with embodiments of self-aligning showerhead apparatus within thin-film deposition systems. The specific embodiments discussed herein are, however, merely demonstrative of specific ways to make and use the invention and do not limit the scope of the invention.

The present invention provides a versatile system that accurately and reproducibly aligns, adjusts, or levels (hereafter "aligns") an adjustable apparatus with respect to a second, stationary apparatus. The present invention provides a standardized spacing or offset component that is placed or secured along an operational surface of the stationary apparatus during alignment procedures. The spacing component is formed or assembled of a dimension or configuration corresponding to the desired or required operational offset between the adjustable apparatus and the stationary apparatus—thereby defining a proper alignment position for the adjustable apparatus.

The adjustable apparatus is brought into proximity with stationary apparatus. The adjustable apparatus is supported upon a self-alignment support system. The self-alignment support system comprises a number of support components that are securely repositionable responsive to pressure exerted against an operational surface of the adjustable apparatus. As the adjustable apparatus is moved toward its operational position vis-à-vis the stationary component, the operational surface of the adjustable apparatus contacts or otherwise engages the offset component. Pressure is exerted, directly or indirectly, by the offset component against the operational surface, as the adjustable apparatus is moved into its desired or required operational position against the offset component. This causes one or more of the support components within the self-alignment support system to slide, move or otherwise shift to accommodate the forced repositioning of the adjustable apparatus by the pressure applied thereto via the offset component. Once aligned, the self-alignment support system retains or secures the new alignment or repositioning of the adjustable apparatus. The offset component may be removed from the stationary apparatus, and normal operation with the repositioned adjustable apparatus may be commenced.

Figure 1:
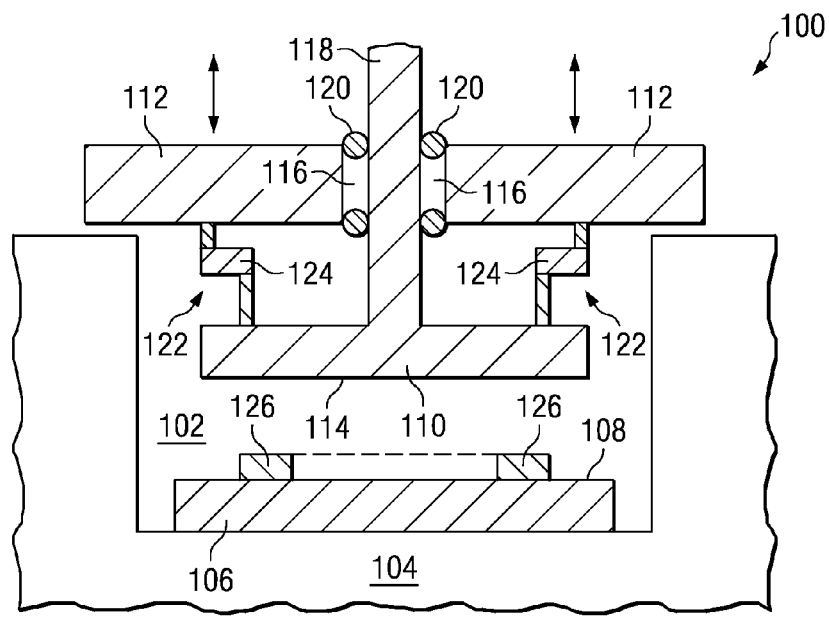
FIG. 1 provides an illustration depicting certain aspects of a self-alignment system in accordance with the present invention.

Certain aspects of the present invention are described in greater detail now with reference to FIG. 1, which depicts one embodiment of a semiconductor wafer processing deposition system 100 according to the present invention. System 100 comprises a thin-film deposition processing chamber 102, bounded by a chamber housing 104. Within the lower portion of chamber 102, a susceptor or heater block 106 is disposed. During the operation of system 100, block 106 remains stationary and, along its upper surface 108, heats a semiconductor wafer disposed thereupon. This heating facilitates the deposition of semiconductor materials onto the semiconductor wafer by dispensing apparatus 110 (e.g., a showerhead). Apparatus 110 is adjustably secured to chamber top 112 by a self-alignment support mechanism, for movement up and down with respect to chamber 102.

In its down position, top 112 locks to or otherwise engages with housing 104 to provide a sealed, controlled environment within chamber 102 during deposition. In many cases, for example, chamber 102 may be heated to high temperature (e.g., 325° C.-450° C.) and reduced to sub-atmospheric pressure, in order to facilitate proper thin-film deposition. In down position, top 112 holds an operational surface 114 of showerhead 110 in operational proximity to surface 108. In its up position, top 112 disengages and lifts away from housing 104, and removes apparatus 110 from chamber 102 by an amount sufficient to allow operational access to chamber 102, for matters such as cleaning or loading/unloading of semiconductor wafers.

Cover 112 has an aperture or channel 116 formed therethrough, in a generally central location thereof. A column 118 is disposed, in a displaceable arrangement, through aperture 116, and couples to an upper portion or surface of apparatus 110. In certain embodiments, column 118 may comprise a conduit or other appropriate supply line for delivering deposition materials to apparatus 110. In other embodiments, column 118 may comprise a support member (e.g., a post) providing support for apparatus 110 in accordance with the present invention. In still other embodiments, column 118 may provide both support and supply functionalities. Column 118 is secured within aperture 116 by one or more gasket members 120 (e.g., O-rings). Members 120 are sturdy and strong enough to provide a seal around column 118 sufficient to ensure proper operational environmental conditions within chamber 102 (e.g., pressurization). Members 120 are also deformable or resilient in nature, such that as apparatus 110 is moved, relative to top 112, then column 118 may also shift accordingly within aperture 116.

System 100 further comprises a self-alignment support system 122, coupled between an upper portion or surface of apparatus 110, and a lower surface of top 112. As depicted in FIG. 1, system 122 comprises a plurality of support components 124, disposed in equal intervals about the upper perimeter of apparatus 110. The support components 124 are formed or fabricated, in accordance with the present invention, to facilitate the repositioning of apparatus 110, and to retain or secure that repositioning. The number of individual components 124 within system 122 may be varied widely, depending upon the size, composition or operation of apparatus 110. For example, only a single component 124 may be desired or required to provide a single axis of alignment for a relatively small showerhead. In many embodiments, however, three support components 124 provide a sufficient range of adjustment over multiple axes for showerhead 110.

When alignment of apparatus 110 is to be performed, top 112 is separated from housing 104, and a standardized spacing or offset component 126 is placed upon surface 108. Component 126 comprises one or more articles of rigid, non-yielding material (e.g., ceramic ring, ceramic or aluminum blocks) sufficient to withstand the operating conditions within chamber 102 and pressures exerted in aligning apparatus 110. Component 126 is formed of a height and contour, and is placed along surface 108 in such a manner, that defines the desired or required opening between surfaces 108 and 114 for normal operation. Component 126 thus serves as a base or frame of reference from which alignment is determined or measured.

Top 112 is then lowered into place, enclosing chamber 102. As top 112 is lowered into place, surface 114 may begin to come into contact with the upper portion(s) of component 126. The closing pressure of top 112 may cause any portion(s) of surface 114 that might be lower than others (i.e., out of alignment) to press against component 126. Component 126 is, however, formed of a non-yielding material, and is disposed upon and supported by stationary block 106. Apparatus 110 is supported by components 124 which, as described in greater detail hereafter, do yield to pressure(s) exerted upon surface 114. Thus, any pressure that may be exerted between surface 114 and component 126, during the closing of top 112, begins the self-alignment process of the present invention.

Once top 112 and housing 104 have securely closed or otherwise engaged, normal operating conditions are initiated within chamber 102, and surface 114 is brought into full contact and engagement with component 126. Any pressure exerted between surface 114 and component 126, induced by the operating conditions within chamber 102, is translated into repositioning pressure against surface 114 via component 126—providing self-alignment of apparatus 110 in accordance with the present invention. For example, any adjustments to environmental pressure (e.g., pressurization or depressurization) within chamber 102 may cause portion(s) of surface 114 to press against component 126, facilitating alignment as previously described. Similar effects caused by thermal expansion and contraction may also exert self-aligning pressure upon apparatus 110. As such pressure(s) are exerted upon apparatus 110, via surface 114, support components 124 adjust in accordance with the present invention to balance the pressure(s) on apparatus 110, and retain its adjusted position vis-à-vis component 126.

Once system 100 has been maintained at operating conditions for a time sufficient to complete showerhead alignment, conditions within chamber 102 are normalized and top 112 is opened. Component 126 is removed from chamber 102, and the closed, operational spatial relationship between surface 108 and surface 114, as previously defined by component 126, is now held in place by support component(s) 124. Normal deposition operations may then resume, after only one alignment iteration has been performed according to the present invention. Allowances or variations that may be desired or require due to, for example, differences in thermal expansion between different materials, can be accounted for by altering the size or configuration of offset component 126.

Figure 2:
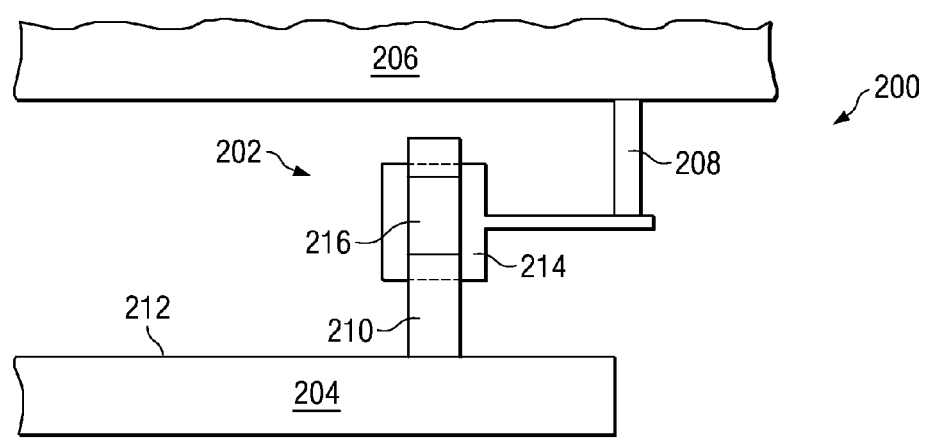
FIG. 2 provides an illustration depicting one embodiment of a support structure in accordance with the present invention.

Referring now to FIG. 2, one general embodiment of a self-alignment support system 200 is depicted. System 200 intercouples a support component 202 between a showerhead 204 and a deposition system exterior component 206 (e.g., removable top, housing sidewall). Component 202 comprises an attachment member 208 that is immovably secured to component 206. Component 202 further comprises a support member 210 that is coupled to, and extends orthogonally from, an upper surface 212 of showerhead 204 near its outer perimeter. A grasping component 214 is coupled to member 208. Component 214 houses a positioning component 216 that engages with a portion of member 210, in a pressure adjustable relationship. Component 216 may comprise a friction fitting (e.g., resilient gasket, resilient sleeve) or ratcheting mechanism that allows member 210 to travel upwardly or downwardly through component 214 as sufficient alignment pressure is applied to showerhead 204. Once such movement under pressure ceases, component 216 retains and secures the position of member 210, and thereby the aligned position of showerhead 204.

The size, dimension, orientation and composition of members 208 and 210, and components 214 and 216, may be varied greatly depending upon the requirements of the tool or system within which system 200 is implemented. For example, the relative size and length of members 208 and 210 are provided such that member 210 may move, within component 214, through a full range of potential adjustment positions for showerhead 204 without contacting component 206. In another example, member 210 may comprise a ceramic rod that provides greater friction with, for example, a rubberized component 216 than a metallic member would. Furthermore, each member, component or subsystem of system 200 may have further features, devices or substructures that further facilitate self-alignment in accordance with the present invention.

Figure 3:
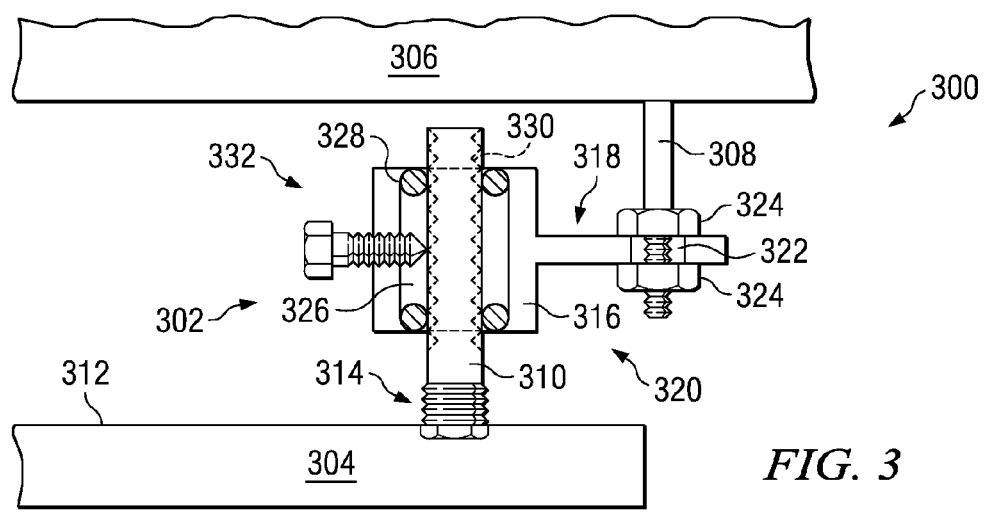
FIG. 3 provides an illustration depicting another embodiment of a support structure in accordance with the present invention.

Such features are illustrated now with reference to FIG. 3, which depicts one embodiment of a self-alignment support system 300 according to the present invention. System 300 comprises a support component 302 intercoupled between a showerhead 304 and a deposition system exterior component 306 (e.g., removable top, housing sidewall). Component 302 comprises an attachment member 308 that is immovably secured to component 306. Member 308 may comprise any suitable attachment structure, such as a ceramic or aluminum bolt or screw. As depicted in FIG. 3, member 308 comprises a bolt secured to component 306.

Component 302 further comprises a support member 310 that is coupled to, and extends orthogonally from, an upper surface 312 of showerhead 304 near its outer perimeter. Support member 310 may comprise any suitable material (e.g., ceramic, aluminum) that conforms to the requirements of the present invention. Member 310 is of a size small enough to avoid direct contact with component 306, but sufficient to allow a full range of adjustment of showerhead 304. Member 310 may be permanently or adjustably coupled to showerhead 304. In the embodiment depicted in FIG. 3, for example, member 310 is coupled to showerhead 304 by a screw-type connection 314.

Component 302 further comprises a grasping component 316 that is coupled to member 308. Component 316 comprises a flange portion 318 that extends laterally from a grasping portion 320. Portion 318 has an aperture 322 formed therethrough. Component 302, via aperture 322, is affixed to member 308 and secured in place by fasteners 324 (e.g., clevis pins, hex nuts). Aperture 322 may comprise a number of textures or contours that facilitate the secure coupling of component 302 to member 308. For example, in embodiments where member 308 is a bolt, aperture 322 may have internal threading that enables component 302 to be screwed directly onto member 308. In alternative embodiments, aperture 322 may comprise additional internal subcomponents (e.g., gaskets, O-rings) to facilitate secure coupling.

Grasping portion 320 comprises a sleeve-type structure, having a channel or aperture 326 formed therethrough that receives and holds a portion of member 310. Portion 320 houses, at one or more locations along aperture 326, one or more positioning components 328. Component 328 engages with some portion of member 310, in a pressure-fitted, pressure-adjustable relationship. Component 328 may comprise, for example, a friction fitting (e.g., resilient gasket, ring clamp) or ratcheting mechanism that allows member 310 to travel upwardly or downwardly through aperture 326 as sufficient alignment pressure is applied upwardly or downwardly to showerhead 304. Once such movement under pressure ceases, component 328 retains and secures the position of member 310, and thereby the aligned position of showerhead 304. In the embodiment depicted in FIG. 3, component 328 comprises O-rings disposed at the upper and lower portions of aperture 326. These O-rings are formed of a size and material composition that provides a secure friction fit with member 310.

In certain embodiments, additional features may be provided within component 302 to further facilitate self-alignment functions. For example, member 310 may be provided with a deviated (i.e., non-smooth) texture, gradation or contour 330 (e.g., notches, ribbing) that works in conjunction with component 328. Contour 330, in conjunction with component 328, may be provided to increase the integrity of the engagement between component 328 and member 310. Contour 330 may also be provided to quantify or scale the amount by which member 210 is moved during alignment—providing more accurate alignments.

In the embodiment depicted in FIG. 3, for example, the O-rings 328 engage with each notch 330 as member 310 is moved up or down. Smaller O-rings may thus be used to increase the amount of pressure required to align showerhead 304, and to more securely hold member 310 in place once alignment is completed. The relative size and number of notches 330 may be altered to provide larger or smaller alignment "steps" along member 310.

In certain embodiments, a locking component 332 may be provided to further secure member 310 in alignment position. As depicted in FIG. 3, component 332 comprises a screw disposed through portion 320, extendable into friction engagement with member 310 within aperture 326. In this embodiment, screw 332 comprises a pointed tip, adapted to engage with features along contour 330. Alternatively, screw 332 may comprise a flat tip that simply abuts member 310 in a frictional manner. Other similar adjustable locking mechanisms (e.g., clamps, pins) may also be provided for component 332.

Thus, according to the present invention, a versatile self-alignment support system is provided in conjunction with other apparatus and methods to render alignment of deposition equipment efficient and accurate. As noted hereinabove, a number of variations and alternative embodiments are comprehended by the present invention. The components, members, and systems of the present invention may be fabrication or formed from a number of suitable materials, depending upon the function of each. Materials (e.g., aluminum, ceramics, high-density plastics or polymers) that can withstand the heat (e.g., ~325° C.-450° C.), the general pressure of the deposition chamber, and pressures exerted on a particular component may be utilized. Certain components, such as O-rings or gaskets, may be formed of any material that can provide the necessary friction or seal, under the environmental stresses, without breaking apart or generating particles that could contaminate the deposition process. Other orientations of components and members are further comprehended. For example, the support systems and alignment processes may be adapted to provide for a horizontal alignment configuration, rather than vertical. The support components of the present invention may be disposed along a chamber sidewall, instead of its top. In other embodiments, the support components may provide deflective or deformable members that yield in response to pressure(s) exerted. These and other variations are comprehended hereby.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. A semiconductor wafer processing system, comprising:
   a processing chamber defined within a housing;
   a heating block disposed in the processing chamber;
   a showerhead disposed within the processing chamber, above the heating block; and
   a support mechanism mounting the showerhead on the housing for self-aligning movement relative to the heating block,
   the support mechanism comprising:
   at least one movable component that responds to pressure exerted on the showerhead to self-align an operational spacing between the heating block and the showerhead, and that maintains the operational spacing when the exerted pressure is removed,
   wherein the support mechanism is movably mounted on the showerhead on a top of the housing for movement toward or away from the heating block, and
   at least one offset component of rigid, non-yielding material within the processing chamber that defines a selected opening between an inner surface of the processing chamber and a bottom surface of the showerhead,
   wherein a closing pressure between the bottom surface of the showerhead and the at least one offset component aligns the bottom of the showerhead, and wherein the alignment of the bottom of the showerhead from the closing pressure between the bottom surface of the showerhead and the at least one offset component self-aligns the operational spacing between the heating block and the showerhead.

2. The system of claim 1, wherein the processing chamber comprises a thin-film deposition chamber.

3. The system of claim 1, wherein the at least one movable component comprises a plurality of frictionally movable components.

4. The system of claim 1, wherein the at least one movable component comprises at least one ceramic member.

5. The system of claim 1, wherein the at least one movable component comprises:
a first member attached to a top or side of the housing; and
a second member attached to the showerhead and movably engaged with the first member for movement toward or away from the top or side of the housing.

6. The system of claim 5, further comprising a locking component for selectively locking the first member in fixed position relative to the top or side of the housing.

7. The system of claim 5, wherein one of the first or second members includes an aperture having an associated friction fitting or ratcheting mechanism; and the other of the first or second member is received within the aperture and acted upon by the friction fitting or ratcheting mechanism.

8. The system of claim 7, further comprising a locking component for selectively locking the other of the first or second member in fixed position with the aperture.

9. The system of claim 1, wherein the at least one offset support is sufficient to withstand operating conditions within the chamber and pressures exerted from the shower head.

10. A semiconductor wafer processing system, comprising:
a housing defining a processing chamber and including a housing top movable between chamber sealing and chamber opening positions;
a heating block having a wafer receiving surface disposed in the processing chamber;
a showerhead disposed within the processing chamber for dispensing material onto the wafer receiving surface; and
a support mechanism mounting the showerhead on the housing top for self-aligning movement relative to the wafer receiving surface when the housing top is in the chamber sealing position; the support mechanism comprising:
a first member attached to the housing top, and a second member attached to the showerhead and movably engaged with the first member,
so that pressure exerted on the showerhead with the housing top in the chamber sealing position will self align an operational spacing between the showerhead and the wafer receiving surface, and
so that the operational spacing will be maintained when the exerted pressure is removed and the housing top is brought into the chamber opening position;
at least one support component of rigid, non-yielding material within the processing chamber that define a selected opening between an inner surface of the processing chamber and a bottom surface of the showerhead,
wherein the exerted pressure between the bottom surface of the showerhead and offset component aligns the bottom of the showerhead, and
wherein the alignment of the bottom of the showerhead as a result of the closing pressure self aligns the position of the support mechanism.

11. The system of claim 10, wherein one of the first or second members includes an aperture having an associated friction fitting or ratcheting mechanism; and the other of the first or second member is received within the aperture and acted upon by the friction fitting or ratcheting mechanism.

12. The system of claim 11, further comprising a locking component for selectively locking the position of the other of the first or second member within the aperture.

13. The system of claim 12, wherein the other of the first or second member comprises a ceramic member.

14. The system of claim 11, wherein the other of the first or second member comprises a ceramic member.

15. The system of claim 10, wherein the at least one offset support is sufficient to withstand operating conditions within the chamber and pressures exerted from the shower head.

16. A semiconductor wafer processing system, comprising:
a housing defining a processing chamber and including a housing top movable between chamber sealing and chamber opening positions;
a heating block having a wafer receiving surface disposed in the processing chamber;
a showerhead disposed within the processing chamber for dispensing material onto the wafer receiving surface; and
a support mechanism mounting the showerhead on the housing top for self-aligning movement relative to the wafer receiving surface when the housing top is in the chamber sealing position; the support mechanism comprising:
a plurality of first members attached to the housing top, and
a plurality of second members attached to the showerhead and movably engaged with respective ones of the first members,
so that pressure exerted on the showerhead with the housing top in the chamber sealing position will self align an operational spacing between the showerhead and the wafer receiving surface, and
so that the operational spacing will be maintained when the exerted pressure is removed and the housing top is brought into the chamber opening position;
at least one offset component of rigid, non-yielding material within the processing chamber that define a selected opening between an inner surface of the processing chamber and a bottom surface of the showerhead,
wherein the exerted pressure between the bottom surface of the showerhead and the offset component aligns the bottom of the showerhead, and
wherein the alignment of the bottom of the showerhead as a result of the closing pressure self aligns the position of the support mechanism.

17. The system of claim 16, wherein members of one of the plurality of first members or the plurality of second members include respective apertures having associated friction fittings or ratcheting mechanisms; and members of the other of the plurality of first members or the plurality of second members are respectively received within the apertures and acted upon by the friction fitting or ratcheting mechanisms.

18. The system of claim 17, further comprising at least one locking component for selectively locking the positions of the other of the first or second member within the respective apertures.

19. The system of claim 18, wherein the members of the other of the plurality of first members or plurality of second members comprise ceramic members received within the respective apertures.

20. The system of claim 17, further comprising at least one locking component for selectively locking the positions of the other of the first or second member within the respective apertures.

21. The system of claim 16, wherein the at least one offset support is sufficient to withstand operating conditions within the chamber and pressures exerted from the shower head.

* * * * *